(12) United States Patent
Hartl et al.

(10) Patent No.: US 6,418,546 B1
(45) Date of Patent: Jul. 9, 2002

(54) CIRCUIT FOR CHECKING A TRISTATE DETECTION CIRCUIT

(75) Inventors: Paul Hartl; Hermann Haberer; Paul Haberl, all of München (DE)

(73) Assignee: Leuze lumiflex GmbH & Co., Fürstenfeldbruck (DE)

( * ) Notice: Subject to any disclaimer, the term of this patent is extended or adjusted under 35 U.S.C. 154(b) by 0 days.

(21) Appl. No.: 09/351,097

(22) Filed: Jul. 9, 1999

(30) Foreign Application Priority Data

Jul. 10, 1998 (DE) .......................................... 198 31 088

(51) Int. Cl.[7] .............................................. G01R 31/28
(52) U.S. Cl. ...................................................... 714/742
(58) Field of Search ...................... 326/56–60; 714/733, 714/742

(56) References Cited

U.S. PATENT DOCUMENTS

| 3,764,995 A | | 10/1973 | Helf, Jr. et al. ................ 714/32 |
|---|---|---|---|
| 5,432,440 A | * | 7/1995 | Bartlett .................... 324/158.1 |
| 5,714,892 A | * | 2/1998 | Bowers et al. ................. 326/60 |
| 5,969,540 A | * | 10/1999 | Hwang .......................... 326/56 |
| 6,028,443 A | * | 2/2000 | Ozaki ........................... 326/16 |
| 6,133,753 A | * | 10/2000 | Thomson et al. .............. 326/56 |

FOREIGN PATENT DOCUMENTS

DE  19736216 A1  3/1998

* cited by examiner

Primary Examiner—Albert Decady
Assistant Examiner—Shelly A. Chase
(74) Attorney, Agent, or Firm—Venable; Robert Kinberg

(57) ABSTRACT

A circuit arrangement for testing of a tristate detection circuit has controllable switches (3–6) which simulate the three states: logical "1", logical "0", and high-impedance on a terminal (K1). Inputs (P1, P2) from comparators (1, 2) of the detection circuit are set to supply voltage or to ground. Switching of the comparators (1, 2) on and off is checked independently of the state on the terminal (K1).

11 Claims, 2 Drawing Sheets

CIRCUIT FOR CHECKING A TRISTATE DETECTION CIRCUIT

CROSS REFERENCE TO FOREIGN APPLICATION

This application claims priority based on German Utility Model 198 31 088.9, filed Jul. 10, 1998, the entire disclosure of which is incorporated herein by reference.

BACKGROUND OF THE INVENTION

The invention relates generally to test circuitry and, particularly, to a circuit arrangement for checking a tristate detection circuit.

In digital technology, for reasons of miniaturization and reducing the number of connections or terminals, a so-called tristate logic is used in which three differentiable logic states can be generated on the terminals. These states are: 1) terminal at logical "1" (supply voltage); 2) terminal at logical "0" (ground); and 3) high-impedance state in which the terminal as such is set to an undefined potential and by means of an additional circuit, it can be set to a potential that is different from the supply voltage and ground. Those skilled in the art employ tristate detection circuits for detecting which of the three states is present.

In safety-related applications (e.g., accident prevention grating, light barriers and the like), in which fail-safe operation is required, it is necessary to check the detection circuit for how it is operating to bring a monitored machine into a safe state in the case of a malfunction of the detection circuit. Therefore, a circuit arrangement is desired for checking a tristate detection circuit to reliably detect all possible errors in the detection circuit.

SUMMARY OF THE INVENTION

The invention meets the above needs and overcomes the deficiencies of the prior art by providing a circuit for checking a tristate detection circuit. Among the several objects and features of the present invention may be noted the provision of such a circuit that permits reliable detection of all possible errors in a tristate detection circuit; and the provision of such a circuit that is economically feasible and commercially practical.

Briefly described, a circuit embodying aspects of the invention simulates the three states of the detection circuit by controllable switches.

According to a preferred embodiment of the invention, a connector that can assume the three states is connected in the middle of a symmetrical voltage divider between supply voltage and ground. The detection circuit has comparators that respond to a voltage drop across resistors of the voltage divider. The controllable switches in the active state connect these resistors and, therefore, a connector of the comparator to ground or to supply voltage, so that regardless of the momentary state to be detected at the connector, the output signal of the comparators will be forced to a defined value (logical "0" or logical "1"). By means of an alternating opening and closing of the individually controllable switches, a change of state will also be created at the output of the comparators. In one test sequence, all permissible combinations of positions of the controllable switches will be run through, so that not only the static state of the output signals of the comparators will be checked, but also their dynamic state, i.e., whether they switch on or off. To increase the fail-safe operation, the circuit arrangement is designed with two channels.

In one embodiment, the voltage divider has four resistors connected in series. The connection to be monitored is connected by a first pair of resistors connected in series to supply voltage, and via a second pair, which is symmetrical to the first, of resistors connected in series to ground. Thus, an electric current flows steadily along the connection, which has the advantage that external switches, which set the connector into the particular electrical state, are always switched under current.

The common node of the resistors of one pair forms a "measured input" of the allocated comparator. This point is forced to supply voltage or to ground by means of the controllable switch, regardless of the state of the connection, since this is "decoupled" electrically from the common node of the resistors of a pair by means of a corresponding resistor.

Preferably, the controllable switches are activated and deactivated alternately in all allowed combinations during a test sequence, so that the comparators have to switch on and also switch off during the course of one complete test cycle. Thus, not only are the states of the individual comparators checked statically, but also a dynamic testing of the changeover of the comparators takes place. Preferably, a test sequence is structured so that after one test phase with an activated, controllable switch, a "read phase" will follow, in which the state of the connection is queried.

The comparators are designed preferably as inverting comparators, that is, at their outputs they have a logical "1" if they have not been "tripped," i.e., the voltage drop at the resistor allocated to it is below a response threshold, and a logical "0" if they have been tripped, i.e., the voltage drop at the allocated resistor is above the response threshold.

Alternatively, the invention may comprise various other methods and systems.

Other objects and features will be in part apparent and in part pointed out hereinafter.

BRIEF DESCRIPTION OF THE DRAWINGS

The invention will be explained in greater detail below in conjunction with the figures and based on one design example. Shown are.

Corresponding reference characters indicate corresponding parts throughout the drawings.

DETAILED DESCRIPTION OF PREFERRED EMBODIMENTS

Figure 1:
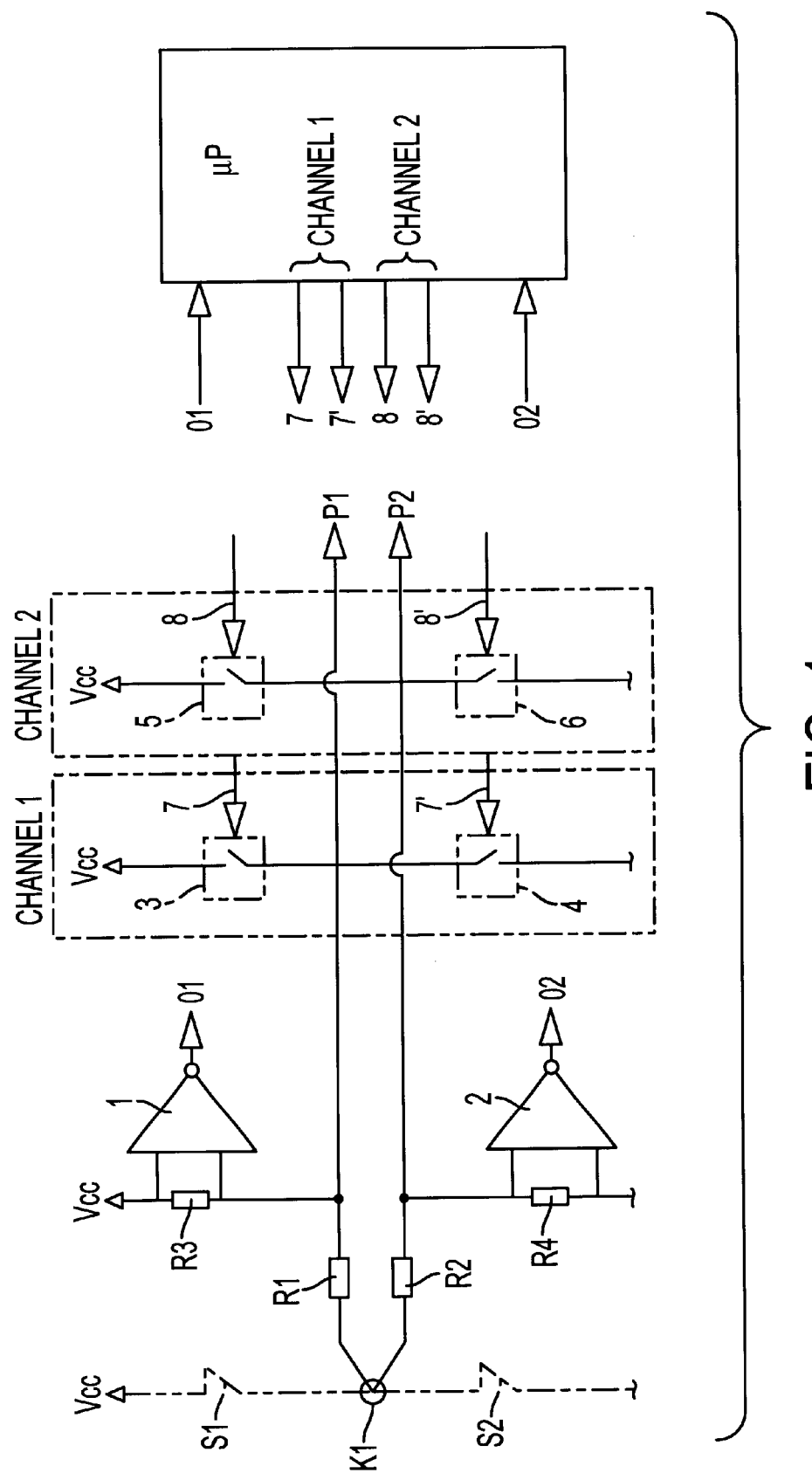
FIG. 1, a fundamental circuit diagram of the circuit arrangement according to the invention.

The circuit arrangement queries the electrical state of a terminal K1, which can assume three "states," namely: 1) supply voltage Vcc; 2) ground potential; and 3) a high-impedance state. These states can be achieved, for example, as follows:

1) The terminal K1 is connected to supply voltage Vcc by means of a switch S1;
2) The terminal K1 is connected to ground potential by means of a switch S2; and
3) If both switches S1 and S2 are open, then the potential of terminal K1 is undefined and it is specified only by an external circuit that designates this state as high-impedance, which can be different from the other two states in a three valve logic (also called tristate logic).

The terminal K1 is located in the middle of a symmetrical voltage divider comprised of resistors R3, R1 and resistors R2, R4. The voltage divider as a whole lies between supply voltage Vcc and ground potential. In one preferred embodiment, the resistors R1 and R2 have the same resistance value (e.g., 1.8 kΩ). Likewise, the resistors R3 and R4 preferably have the same resistance value (e.g., 560Ω) and, thus, in an actual design example, the resistors R3 and R4 have less resistance than the resistors R1 and R2. If both switches S1 and S2 are open, then half the supply voltage Vcc is applied to the terminal K1. It should be stressed that the terminal K1 in this circuit always has a flowing current, which increases the dependability of the switching of switch S1 and/or S2.

Depending on the control state of the switches S1 and S2, different size currents flow through the voltage dividers R1–R4, so that the voltage drop to the resistors R3 and R4 also depends on the control state of the switches S1 and S2. For example, if the switch S1 is closed and the terminal K1 is set to supply voltage Vcc, then no current will flow through the resistors R3 and R1, instead it will only flow through the resistors R2 and R4. Thus, the voltage drop across resistor R3 goes to zero, and the voltage drop across resistor R4 is relatively great. But if the terminal K1 is set to ground potential, i.e., S1 is open and S2 is closed, then a current will flow only from Vcc through R3 and R1 to ground; the voltage drop across R3 is large, and across R4 is zero.

If both switches S1 and S2 are open, the terminal K1 is in the high-impedance state and, thus, the current will flow from Vcc through R3, R1, R2 and R4 to ground. The voltage drop to R3 and R4 is the same and has a smaller value than in the other two stated cases. This value is designated as the average value.

To differentiate the three defined states, the voltage drop across the resistors R3 and R4 is monitored by a comparator circuit, which includes comparators 1 and 2, respectively. These comparators are adjusted so that in case of a large and average voltage drop at their outputs O1 or O2, they will take on a control state (here: a logical "0"), and in case of a voltage drop of zero, the other control state (here: a logical "1"). The three possible states of the terminal K1 (ground= GND; high-impedance=Z; supply voltage=Vcc) generate the values stated in the following TABLE I for the outputs O1 and O2 of the comparators 1 and 2; these values distinguish the individual states from each other.

TABLE I

| K1 | O1 | O2 |
|---|---|---|
| GND (ground) | 0 | 1 |
| z (high-impedance) | 0 | 0 |
| Vcc (supply voltage) | 1 | 0 |

The state O1=O2=1 is thus not allowed. To check for satisfactory operation, the solution principle of the invention provides for simulation of the control states of the switches S1 and S2 in an internal circuit, so that controllable switches 3–6 are created. Each pair of switches 3, 4; 5, 6 is connected in series between supply voltage Vcc and ground, where the common node of the switches 3 and 4 is connected to the common node P1 of the resistors R1 and R3, and the common node of the switches 5 and 6 is connected to the common node P2 of the resistors R2 and R4. Thus, the switches 3 and 5 simulate the state of the switch S1 and the switches 4 and 6 simulate that of switch S2.

For example, if the switch 3 is closed by a control signal to a control line 7, then supply voltage Vcc is applied to the point P1. Thus, the voltage drop across R3 will go to zero and the voltage drop across R4 increases and the comparator 2 has a logical "0" at its output O2, while the output O1 of the comparator 1 is set to logical "1". In a corresponding way, when switch 3 is open and switch 4 is closed, the point P1 is set to ground. There is a large voltage drop across R3. The output O1 of the comparator 1 is then at logical "0". There is no voltage drop across resistor R4. The output O2 of the comparator 2 is at logical "1". If both switches 3 and 4 are open, which corresponds to the high-impedance state of the terminal K1, then the same, average voltage drop occurs across both resistors R3 and R4. Both comparators 1 and 2 have a logical "0" at their outputs.

The circuit arrangement has a two-channel design. The second channel is formed by the switches 5 and 6 with the control lines 8 and 8', as well as the point P2.

The testing of the circuit arrangement by means of the switches 3 to 6 occurs independently of the setting of the switches S1 and S2 and is carried out as a dynamic test, i.e., changes in the control states are implemented at the outputs O1 and O2. The control state of the switches S1 and S2 does not affect the test, since the terminal K1 and thus, the switches S1 and S2, are "decoupled" from test points P1 and P2 by means of the resistors R1 and R2. For example, if S1 is closed, K1 is at supply voltage and the voltage drop across R3 will be zero, and thus, the closing of switch 4 will cause the point P1 to go to ground potential so that a voltage drop will occur across R3 and the output O1 will switch to logical "0".

When running through a test cycle, all possible errors are detected, regardless of the setting of the switches S1 and S2. A test sequence is run through cyclically within a few microseconds, alternating with the checking of the state of terminal K1, and the states presented in the following TABLE II are checked.

TABLE II

| P1 | P2 | O1 | O2 |
|---|---|---|---|
| 1 | z | 1 | — |
| z | 1 | — | 0 |
| 0 | z | 0 | — |
| z | 0 | — | 1 |
| z | z | neither "1" | |

The states of the outputs O1 and O2 denoted by "-" are not evaluated, since they may be dependent on the setting of the switches S1 and S2.

In the initial state the four switches 3 to 6 are open, the state of the terminal K1 is queried and passed along to the outputs O1 and O2 according to TABLE I. Then the test sequences SQ denoted in TABLE III are run through.

TABLE III

| SQ | P1 | P2 | Test |
|---|---|---|---|
| 0 | 1 | z | K = 0 (O1 = 1) Can O1 be switched on? |
| 1 | z | z | O1 or O2 = 0  Can at least O1 or O2 be switched off? |
| 2 | z | 1 | K = 0 (O2 = 0) Can O2 be switched off? |
| 3 | z | z | O1 or O2 = 0)  Can at least O1 or O2 be switched off? |
| 4 | 0 | z | K = 1 (O1 = 0) Can O1 be switched off? |
| 5 | z | z | O1 or O2 = 0  Can at least O1 or O2 be switched off? |
| 6 | z | 0 | K = 1 (O2 = 1) Can O2 be switched on? |
| 7 | z | z | O1 or O2 = 0  Can at least O1 or O2 be switched off? |

In test sequence 0, the switch 3 is closed, the point P1 goes to supply voltage. There is no voltage drop across resistor R3, the output O1 goes to "1" independently of the switch setting S1 and S2. The output signal corresponding to the state of the terminal K1 is applied to the output O2 due to the setting of the switch S1 and S2. In the next sequence 1, the switch 3 is again opened, the state of the terminal K1 is queried and at least one of the two states O1 or O2 must be at logical "0". In sequence 3, all switches are opened again and queried to determine whether one of the outputs O1 or O2 has a logical "0". In sequence 4, the switch 4 is closed, thus, the point P1 is thus set to ground. The output O1 must then be at logical "0". In sequence 5, all switches are opened again and at least one of the two signals O1 or O2 must be at logical "0".

In sequence 6, the switch 6 is closed. Thus, the point P2 is at ground potential. The output O2 then must have a "1". In the last sequence 7, all switches 3 to 6 are opened again and at least one of the signals O1 or O2 must be at logical "0".

With these tests it can be determined whether both outputs O1 and O2 switch in both directions, i.e., that they can be switched both on and off. Thus, all possible faults will be detected. For example, if one of the comparators 1 or 2 is defective, then the allocated output signal O1 or O2 cannot be switched any more, which will be detected by the test sequence.

Also, a self-test of the test circuit can be performed. For example, if one of the switches 3 to 6 cannot be switched, e.g., because a corresponding transistor has failed, then the fault will also be detected by the test sequence, since the switching cannot always be carried out in the test sequences described above. Also, a line break to the terminal K1 will be detected, since at least one of the signals to O1 or O2 must be logical "0" in the test sequences 1, 3, 5 and 7 of TABLE III. But in case of a line break, R1 and R2 will be high-impedance, and thus no current will flow along the path Vcc-R3-R1-R2-R4-ground; both outputs O1 and O2 are then at logical "1", which is defined as an impermissible state (compare TABLE II), so that this error will also be recognized.

Figure 2:
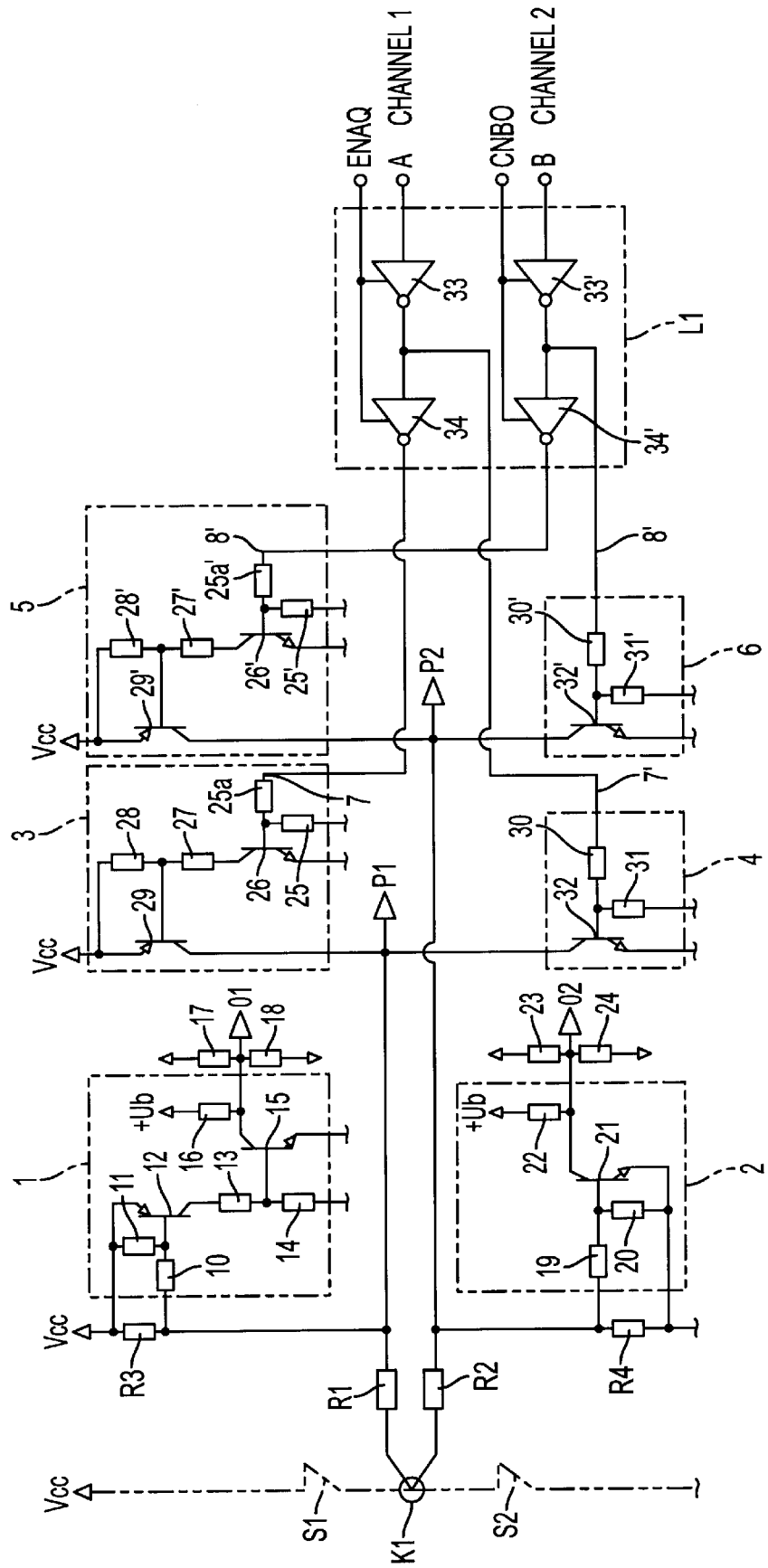
FIG. 2, a more detailed circuit diagram of the circuit arrangement according to FIG. 1.

FIG. 2 shows a more detailed circuit diagram of the circuit arrangement according to the invention, where the same reference symbols used in FIG. 1 denote the same or functionally equivalent components.

The comparator 1 of FIG. 1, whose input terminals are in parallel with resistor R3, has a resistor 10 that is connected to the point P1. A resistor 11 is connected with the other terminal of the resistor 10 and with the supply voltage. In parallel with the resistor 11 there is a base-emitter path of a transistor 12, whose collector is connected in series with resistors 13 and 14, where the resistor 14 is connected to ground. The common node of resistors 13 and 14 is connected to the base of another transistor 15, whose emitter is grounded and whose collector is connected via resistor 16 to a positive voltage Ub of, e.g., +5V, and corresponds to the logic voltage of a microprocessor connected to the terminal O1. The resistor 16 acts as a so-called pull-up resistor. Finally, the output O1 is placed between a voltage divider made of resistors 17 and 18. R17 and R18 are provided in order to decouple the channels of the two microcontrollers.

If the resistor R3 has no current, i.e., if it has no voltage drop, then the transistor 12 is blocked, the base of the transistor 15 is set to ground and thus, also the transistor 15 is blocked, so that its collector is at the voltage Ub by means of the pull-up resistor 16. Thus, the output O1 has a logical "1". In the case of a sufficiently large voltage drop across R3, the transistor 12 completes the circuit, and thus the base voltage to transistor 15 increases to that it will also complete the circuit. The output O1 thus goes to logical "0".

In a similar manner, a comparator is designed with resistors 19 and 20 and a transistor 21 whose collector is connected to the voltage Ub via a pull-up resistor 22 in parallel with the resistor R4. Here, too, the output O2, i.e., the collector of the transistor 21, is connected between the resistors 23 and 24 which compose a voltage divider. If there is no voltage drop across resistor R4, then the transistor 21 is blocked and the voltage +Ub is applied to the output O2 via the pull-up resistor 22. If the voltage drop across resistor R4 is sufficiently large, then the transistor 21 switches and the output O2 goes to logical "0", i.e., ground potential.

The switches 3 to 6 here are designed as transistor switches. The switches 3 and 5 or 4 and 6 have the same design, which is why their components have the same reference designations, which differ from those used for switches 5 and 6 only by use of a designation. The switch 3 has a transistor 29, whose emitter is connected to supply voltage Vcc and whose collector is connected to the point P1. The base of the transistor 29 is connected between two resistors 27 and 28. The resistor 28 is connected to the supply voltage Vcc. The resistor 27 is connected to the collector of a transistor 26, whose emitter is set to ground potential. The base of the transistor 26 is connected to ground via resistor 25. The base of the transistor 26 or 26' is connected via a base series resistor 25a to a control input 7 or 8. If a positive control voltage is applied to the control input 7 or 8, then the transistor 26 or 26' will conduct. The base voltage of the transistor 29 is reduced, so that it will likewise conduct, so that the point P1 will be set to supply voltage.

The switch 4 contains a transistor 32 whose collector is connected to the point P1 and whose emitter is connected to ground. A base resistor 31 is connected to ground. In addition, the base of the transistor 32 is connected via a resistor 30 to the control input 7' or 8'. If a control voltage is applied to the control input 7' or 8', then the transistor 32 conducts and connects the point P1 to ground.

In an analogous manner, the switches 5 and 6 are connected to the control input 8 or 8' at the point P2.

The switches 3 to 6 are driven by means of an inverting gate 33, 34, or 33', 34'. The input to the gate 33 is connected to a control input A for the first channel. The output of the gate 33 is connected to the control input 7' of the switch 4 and to one input of the gate 34, whose output is connected to the control input 7. In an analogous manner, the gates 33' and 34' are connected to the control inputs 8 and 8' of the switches 5 and 6. The input of the gate 33' is connected to one control input B, to which the test signal is applied for the second channel. The gates 33 and 34 or 33' and 34' each have enable inputs that are connected in pairs to inputs ENAQ or ENBQ. The following allocation of trigger signals is obtained for the test sequences provided in TABLE III:

TABLE IV

| SQ | P1 | P2 | A | ENAQ | B | ENBQ |
|----|----|----|---|------|---|------|
| 0 | 1 | z | 1 | 0 | x | 1 |
| 1 | z | z | x | 1 | x | 1 |
| 2 | z | 1 | x | 1 | 1 | 0 |
| 3 | z | z | x | 1 | x | 1 |
| 4 | 0 | z | 0 | 0 | x | 1 |
| 5 | z | z | x | 1 | x | 1 |
| 6 | z | 0 | x | 1 | 0 | 0 |
| 7 | z | z | x | 1 | x | 1 |

The triggering takes place by means of one microprocessor, or in the case of two-channel operation, by means of two microprocessors corresponding to the microprocessor µP of FIG. 1. In the individual control states, the microprocessors then check signals at the outputs O1 and O2 and if an error is found, they implement suitable control actions, such as shutting down a machine.

In view of the above, it will be seen that the several objects of the invention are achieved and other advantageous results attained.

As various changes could be made in the above constructions and methods without departing from the scope of the invention, it is intended that all matter contained in the above description or shown in the accompanying drawings shall be interpreted as illustrative and not in a limiting sense.

What is claimed is:

1. A checking circuit for detecting errors in a tristate detection circuit, said detection circuit having an input receiving a signal representative of one of three logical states, said checking circuit comprising:
    a plurality of controllable switches simulating three logical states at the input to the detection circuit.

2. The circuit of claim 1 further comprising a symmetrical voltage divider between a supply voltage and ground, said voltage divider having a terminal connected in the middle of the voltage divider for assuming the three states, and further comprising a comparator circuit responding to a voltage drop across the voltage divider.

3. The circuit of claim 2 wherein the controllable switches have an active state for setting the potential on the resistors of the voltage divider to ground or to supply voltage, independently of the state to be detected at the terminal.

4. The circuit of claim 2 wherein the voltage divider comprises four resistors connected in series and has a first branch located between the supply voltage and the terminal and a second branch located between the terminal and ground, each branch having a pair of resistors, each pair of resistors of each branch having a common node connected to a measured input of an associated comparator of the comparator circuit and a pair of associated controllable switches.

5. The circuit of claim 2 wherein the terminal has a current flowing through the voltage divider during fail-safe operation, independent of its electrical state.

6. The circuit of claim 2 wherein the comparator circuit comprises two inverting comparators, each of said inverting comparators providing a logical "0" at its output when a difference in voltage on its inputs exceeds a threshold value and providing a logical "1" at its output when the difference in voltage on its inputs is below the threshold value.

7. The circuit of claim 6 further comprising a pull-up resistor connecting the output of each comparator to a logic voltage.

8. The circuit of claim 2 wherein the plurality of controllable switches are divided into pairs and each pair of controllable switches is connected in series between the supply voltage and ground and has a common node connected to one input of an associated comparator of the comparator circuit.

9. The circuit of claim 1 further comprising two mutually independent operating channels.

10. A checking circuit for detecting errors in a tristate detection circuit, said detection circuit having an input receiving a signal representative of one of three logical states, said checking circuit comprising:
    a plurality of controllable switches simulating three logical states at the input to the detection circuit; and
    at least one microprocessor continuously and cyclically creating control signals for default sequences of switch settings of the controllable switches.

11. The circuit of claim 10 wherein each control sequence continuously and alternately activates one of the controllable switches and subsequently deactivates all controllable switches, and in the latter phase, the state of the terminal is queried while a self-test is conducted with an activated, controllable switch.

* * * * *